United States Patent
Li et al.

(10) Patent No.: US 7,549,134 B1
(45) Date of Patent: Jun. 16, 2009

(54) METHOD AND SYSTEM FOR PERFORMING CROSSTALK ANALYSIS

(75) Inventors: Jun Li, San Jose, CA (US); Athanasius Spyrou, Sunnyvale, CA (US); Hong Zhao, Fremont, CA (US); Hsien-Yen Chiu, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 301 days.

(21) Appl. No.: 11/479,279

(22) Filed: Jun. 30, 2006

Related U.S. Application Data

(62) Division of application No. 10/651,617, filed on Aug. 29, 2003, now Pat. No. 7,073,140.

(60) Provisional application No. 60/407,440, filed on Aug. 30, 2002.

(51) Int. Cl.
*G06F 17/50* (2006.01)

(52) U.S. Cl. .................... 716/5; 716/4; 716/6

(58) Field of Classification Search .......... 716/4–6
See application file for complete search history.

(56) References Cited

U.S. PATENT DOCUMENTS

| | | | |
|---|---|---|---|
| 6,018,623 | A | 1/2000 | Chang et al. |
| 6,353,917 | B1 | 3/2002 | Muddu et al. |
| 6,539,527 | B2 * | 3/2003 | Naffziger et al. ........... 716/5 |
| 6,772,403 | B1 * | 8/2004 | Sasaki ...................... 716/6 |
| 6,832,180 | B1 * | 12/2004 | Sutera et al. ............. 703/13 |

OTHER PUBLICATIONS

Khan et al. "A 150-MHz Graphics Rendering Processor With 256-Mb Embedded DRAM," IEEE Journal of Solid State Circuits, Nov. 2001, vol. 36, No. 11, pp. 1775-1784.

Niemazie et al. "260Mb/s Mixed-Signal Single-Chip Integrated System Electronics fro Magnetic Hard Disk Drive," 1999 IEEE International Solid-State Circuits Conference / Session 2 / Paper MP 2.5, Feb. 1999, Digest of Technical Papers, pp. 42-43 and 443.

Khan et al. "A 150MHz Graphics Rendering Processor with 255-Mb Embedded DRAM," ISSCC 2001 / Section 9 / Integrated Multimedia Processors / 9.6, Feb. 2001, pp. 150-151 and 442.

Sani Nassil, "Delay Variability: Sources, Impact and Trends," ISSCC 2000 / Session 22 / TD: Low-Power and Digital Techniques / Paper VP 22.4, Feb. 2000, pp. 368-369, Digest of Technical Papers.

(Continued)

*Primary Examiner*—Jack Chiang
*Assistant Examiner*—Brandon W Bowers
(74) *Attorney, Agent, or Firm*—Vista IP Law Group, LLP

(57) ABSTRACT

Disclosed is an improved approach for performing crosstalk and signal integrity analysis in which multiple variables are taken into account when analyzing the effects of on-chip crosstalk, such as for example coupled wire length, ratio of coupling capacitance, and aggressor and victim driver types. Rather than performing a full-chip simulation, the potential crosstalk effects can be pre-characterized by performing simulation/modeling over specific net portions by systematically changing the values of these multiple variables. A set of patterns characterized from the variables are formed from the modeling. During the analysis process, the IC design is checked of the presence of the patterns, from which is produced the expected delay impact for crosstalk in the design.

16 Claims, 9 Drawing Sheets

OTHER PUBLICATIONS

McCormick et al. "Waveform Moment Methods for Improved Inteconnection Analysis," 27th ACM/IEEE Design Automation Conference, 19990, pp. 406-412.

Ratzlaff et al. "RICE: Rapid Interconnect Circuit Evaluator," 28th ACM/IEEE Design Automation Conference, Paper 33.1, 1991, pp. 555-560.

Pillage, et al. "Asymptotic Waveform Evaluation for Timing Analysis," IEEE Transactions on Computer Aided Design, Apr. 1990, vol. 9 No. 4, pp. 352-366.

S. Naffziger, "Design Methodologies for Interconnects in GHZ+ ICs," IEEE International Solid State Circuits Conference Short Course, Feb. 1999.

Khan, "Physical Design Methodology Best Practices: Nanometer and RTL-down closure," IEEE DATC Electronic Design Processes Workshop, Monterey, California, Apr. 2001.

* cited by examiner

METHOD AND SYSTEM FOR PERFORMING CROSSTALK ANALYSIS

CROSS-REFERENCE TO RELATED APPLICATIONS

This application is a divisional of U.S. application Ser. No. 10/651,617, filed Aug. 29, 2003, now U.S. Pat. No. 7,073,140 which claims the benefit of U.S. Provisional Application No. 60/407,440, filed Aug. 30, 2002, both of which are hereby incorporated by reference in their entireties.

BACKGROUND AND SUMMARY

The present invention relates generally to electronic circuit design and manufacturing.

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Rapid developments in the technology and equipment used to manufacture semiconductor ICs have allowed electronics manufacturers to create smaller and more densely packed chips in which the IC components, such as wires, are located very close together. When electrical components are spaced too close together, the electrical characteristics or operation of one component may affect the electrical characteristics or operation of its neighboring components. The reaction or noise that is triggered by this interference between components is called the "crosstalk" effect.

Many types of crosstalk effects may occur in a circuit. For example, if a first wire ("victim") is supposed to be in a stable state but its neighboring wire ("aggressor") is moving up or down, then excess interference from the aggressor wire may pull the victim wire up or down with it. If the victim wire improperly and unexpectedly leaves its stable state, this could cause the intended operation of the IC to fail. As another example, if the current in an aggressor wire is in the same direction as the current in a nearby victim wire, the resultant crosstalk may cause the victim wire to switch too quickly. On the other hand, if the current in an aggressor wire is in the opposite direction from the nearby victim wire, then the resultant crosstalk may cause the victim wire to switch too slowly. In either case, the crosstalk effect may cause the IC to fail.

Therefore, it is highly desirable to be able to obtain accurate estimates of the effects of crosstalk before finalizing the design of an IC. Delay calculations can be performed to determine whether the IC design creates excessive crosstalk that can cause the IC to fail.

One approach for handling this type of analysis is to perform a full-chip simulation. The full-chip simulation involves simulation activity that checks the performance of the entire chip and its components. While this approach may be relatively accurate, the problem with this approach is that it is normally very expensive to run a full-chip simulation given the size, complexity, and number of components on modern IC designs. Simulating an IC design having hundreds of thousands or millions of components could consume an inordinate amount of time and computing equipment. As technology progresses and the complexity and number of components increase on typical designs, this approach becomes ever more impractical.

To obtain faster analysis results, another proposed approach is to drive crosstalk analysis from a measurement of the ratio of coupled capacitance from any neighbor to total net capacitance, assuming coincident switching in opposite directions between the aggressors and the affected victim signals. Unfortunately, while this simplistic solution that may be faster than a full-chip simulation, it may also result in inaccurate approximations of the true delay characteristics of the design, since this approach only considers capacitance when determining delay. The problem is that if the delay characteristics are underestimated, then unexpected delays may cause the chip to fail. However, if the delays characteristics are overestimated, this may cause the designer to over-design the chip to address "phantom" problems that do not truly exist in the chip design.

Disclosed is an improved approach for performing crosstalk and signal integrity analysis. According to an embodiment of the invention, multiple variables are taken into account when analyzing the effects of on-chip crosstalk, such as for example coupled wire length, ratio of coupling capacitance, and aggressor and victim driver types. Rather than performing a full-chip simulation, the potential crosstalk effects can be pre-characterized by performing simulation/modeling over specific net portions by systematically changing the values of these multiple variables. A set of patterns characterized from the variables are formed from the modeling. During the analysis process, the IC design is checked of the presence of the patterns, from which is produced the expected delay impact for crosstalk in the design. Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

DETAILED DESCRIPTION

The present invention is directed to a method and mechanism for performing crosstalk and signal integrity analysis. In an embodiment, multi-variable pattern analysis is performed to implement the crosstalk analysis. Generally, this approach is performed by determining a set of multi-variable patterns corresponding to characteristics related to crosstalk effects. Each of these patterns can be analyzed and associated with a delay impact. Once an IC design is ready to be analyzed, the design is reviewed to determine whether any of the pre-characterized patterns are identified. The delay impact can therefore be readily determined from identifying these patterns.

Figure 1:
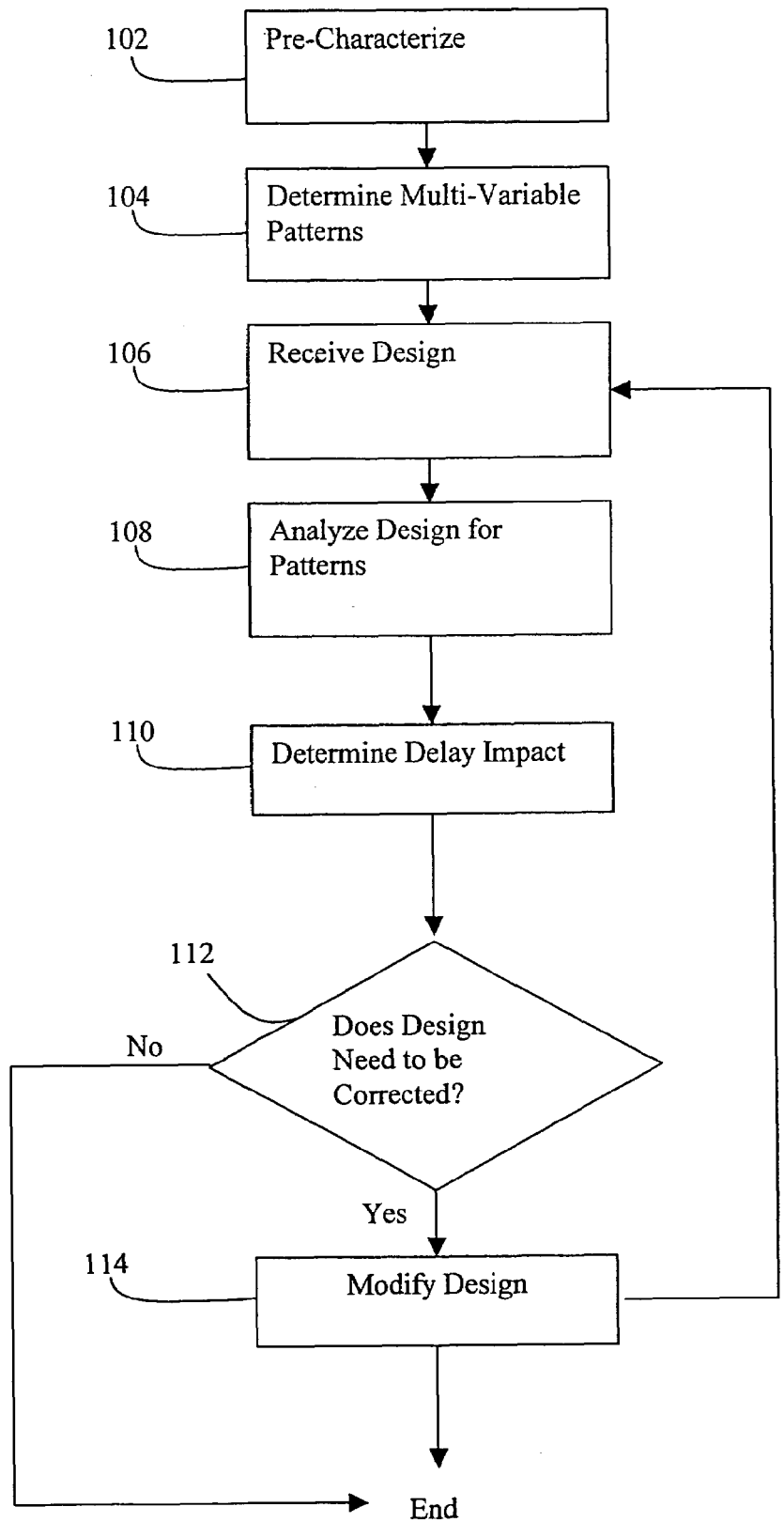
FIG. 1 is a flowchart of an embodiment of a process for crosstalk analysis.

FIG. 1 shows a flowchart of a process for crosstalk analysis according to an embodiment of the invention. At 102, device-level pre-characterization is performed. This action can be accomplished by performing device-level simulations/modeling that are run by systematically modifying the value of variables that are to be considered for the multi-variable patterns of the approach. For example, assume that the present model takes into account four variables which affect on-chip crosstalk: (a) Coupled wire length; (b) coupling ratio; (c) aggressor driver type such as strength or size; and (d) victim driver type such as strength or size. The device-level simulations can performed by modifying each of these variable in turn to assess its impact on delay degradation or reduction for specific net portions of device configurations, e.g., by using a set of approximately or more than 192 simulations per delay transition edge to analyze the potential effect of crosstalk-induced delay degradation or reduction as a function of these variables.

The results of these simulations are used to develop a numerical model which could predict the effect of delay degradation or reduction as a function of these four variables without requiring full circuit simulation. These models form a set of multi-variable patterns that can be collected into a database, chart or table (104). In this example, each pattern would have four variables comprising wire length, ratio of coupling capacitance, aggressor size, and victim size. A set of such patterns having differing values for each variable would exist in the database, with an expected delay impact value(s) for the presence of each pattern.

At 106, an IC design is received for analysis. Analysis is performed by determining whether any of the identified patterns in the database are present in the IC design (108). Different levels of analysis can be performed. For a thorough study, the entire chip can be checked for the existence of the identified patterns. For faster results, only portions of the chip design is checked for the presence of the patterns. For example, a designer may choose to only check wires/busses that are over a certain length or may only choose to check certain types or regions of busses or wires.

The delay impact of crosstalk on the IC design can be determined based upon the delay impacts from the individual patterns that are identified (110). Based upon the identified delay impact from crosstalk, a determination can be made whether design modification is necessary (112). If so, then design modifications are performed to correct the problem, e.g., by adding buffers, modifying driver strengths and/or enhancing grid spacing—to ensure acceptable crosstalk immunity before design tape-out.

Figure 2:
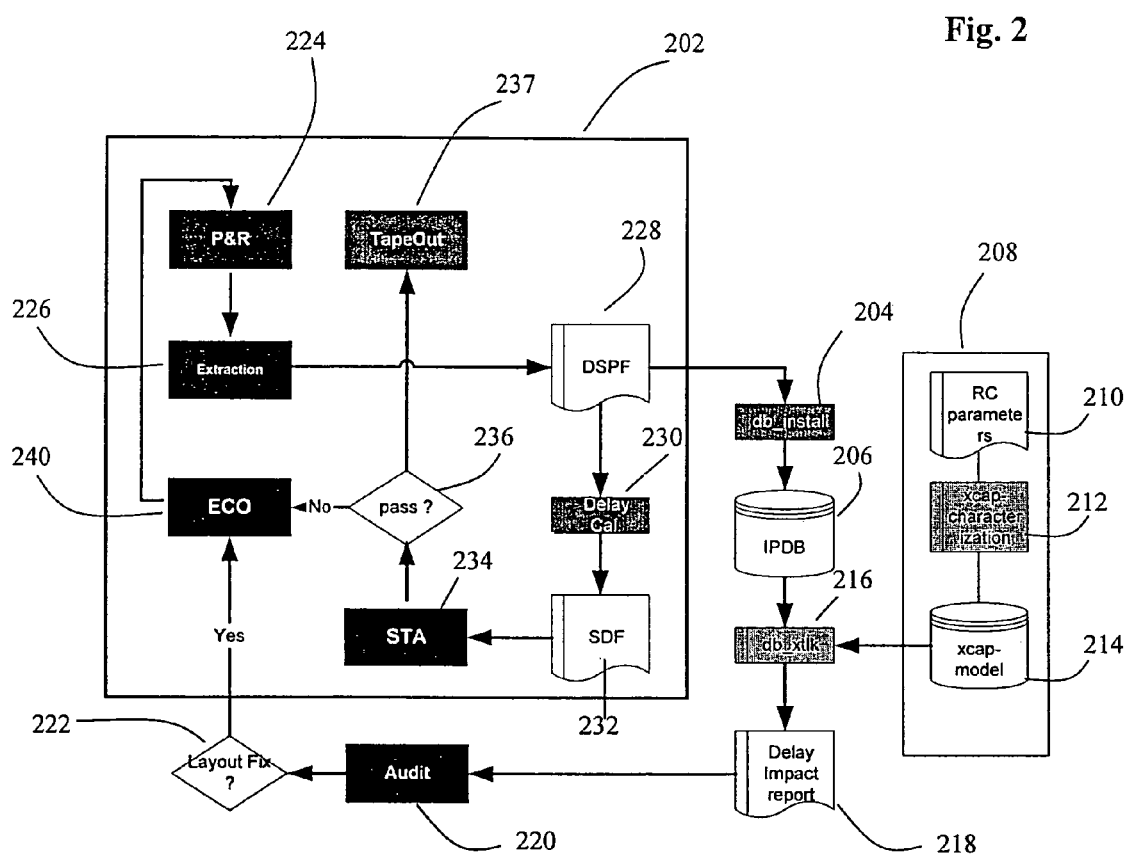
FIG. 2 is diagram of components and process actions to perform crosstalk analysis according to an embodiment of the invention.

FIG. 2 shows a more detailed process flow according to an embodiment of the invention. The contents of 202 shows example components and actions that are used in the process for designing an IC. While familiar to those skilled in the art, a brief explanation of some of these components and actions will now be provided. Box 224 represents the place and route process that is used to create a physical layout of the IC design. Physical and device level characteristics of the IC design are extracted at 226, which are recorded at 228. Delay calculations are performed at 230 which are stored at 232. Static timing analysis is performed at 234 and determination is made at 236 whether the timing characteristics for the design are acceptable. If so, then tapeout occurs at 237. If not, then the process proceeds to 240 for an engineering change to be implemented for the circuit, e.g., via an engineering change order (ECO).

Aspects of the present invention are shown in 208, in which RC parameters and characteristics of the relevant devices are stored at 210. The RC parameters and characteristics are used in a pre-characterization process 212 (which can be performed independently of the timeframe for 202, and therefore can be performed before, during, or even after the actions of box 202). As noted above, this pre-characterization action results in a set of multi-variable patterns and expected delay impact determinations that are stored in database 214.

In an embodiment, the signal slew rate, equivalent load capacitance, node-to-node and net-to-net coupling capacitance, and delay data are maintained in a fully hierarchical database. Loading capacitance at each driving node and signal slew rate at each receiving node are computed, so that under-driven or high load nets exceeding slew rate limits (e.g., 3 ns) can be determined.

At 204, the design information from 202 is extracted and placed in a database 206, e.g., such as the database generated by the hierarchical database used by the SignalStorm tool available from Cadence Design Systems, Inc. of San Jose, Calif. At 216, the design from 206 is analyzed to identify patterns from database 214 using the process described in FIG. 1. Based upon any identified patterns, a delay impact report 218 can be generated. The following is an example format for the contents of this delay impact report 218:

Agressor net name(instance:driver type:pin) ratio(Cxtk/Ctotal) rise_d fall_d Victim net name(instance:driver type:pin) Ctotal Cxtk ratio(Cxtk/Ctotal) max rise max fall An audit is performed at 220 to determine the extent of the delay impact. A determination is made at 222 whether the design should be changed to address the delay impact. If so, then the process returns back to 240. A replace or insert approach can be take to modify the design netlist.

ILLUSTRATIVE EXAMPLE

This section presents an illustrative example of the application of an embodiment of the invention. As noted above, signal integrity is analyzed and managed by developing design guidelines to manage signal integrity by simulating specific net configurations. The net configurations for a set of multi-variable patterns are then checked against an IC design to determine the delay impact of crosstalk.

Figure 3:
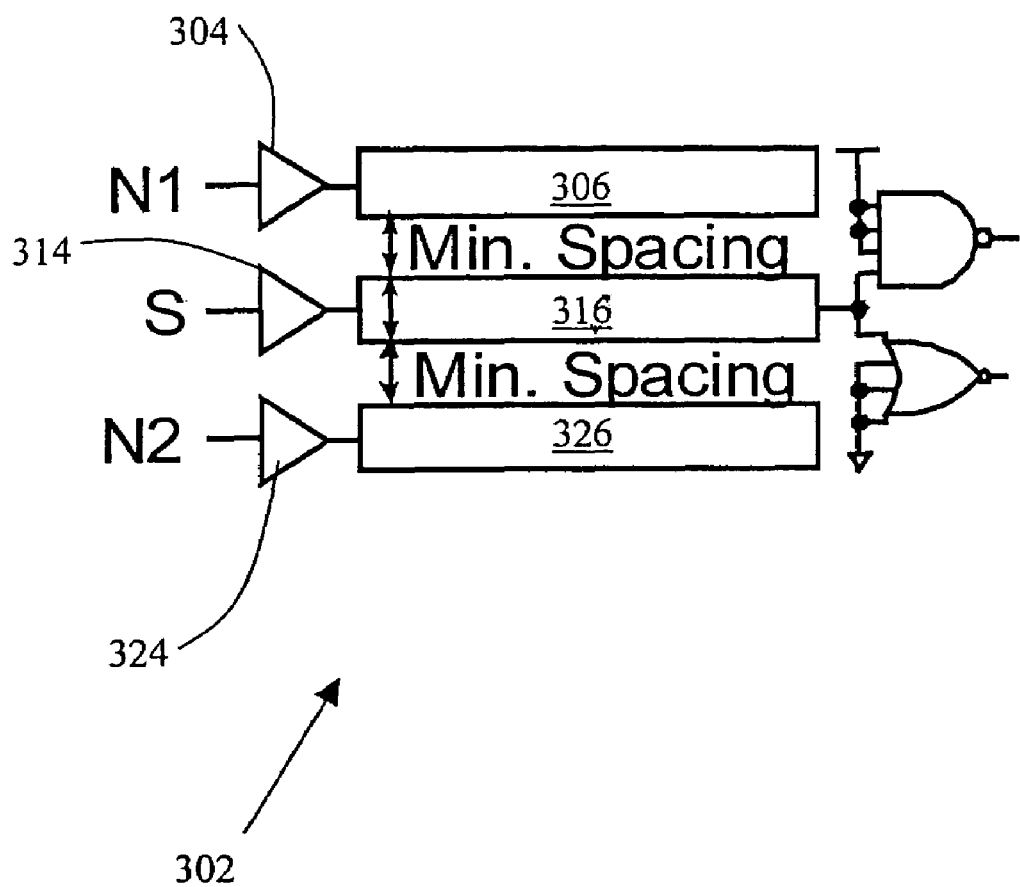
FIG. 3 is an example circuit topology.

FIG. 3 shows an example topology that can be analyzed for the presence of aggressor/victim coupled nets. FIG. 3 shows three parallel wires 306, 316, and 326. Each wire is associated with a driver. Thus, wire 306 is associated with driver 304, wire 316 associated with driver 314, and wire 326 associated with driver 324. The design rules will specify the minimum spacing requirements between the wires.

In this configuration, each wire can be either a victim or an aggressor. Therefore, the configuration is modeled multiple different ways because the aggressor may change depending upon the specific conditions to which the circuit is subjected.

Figure 4A:
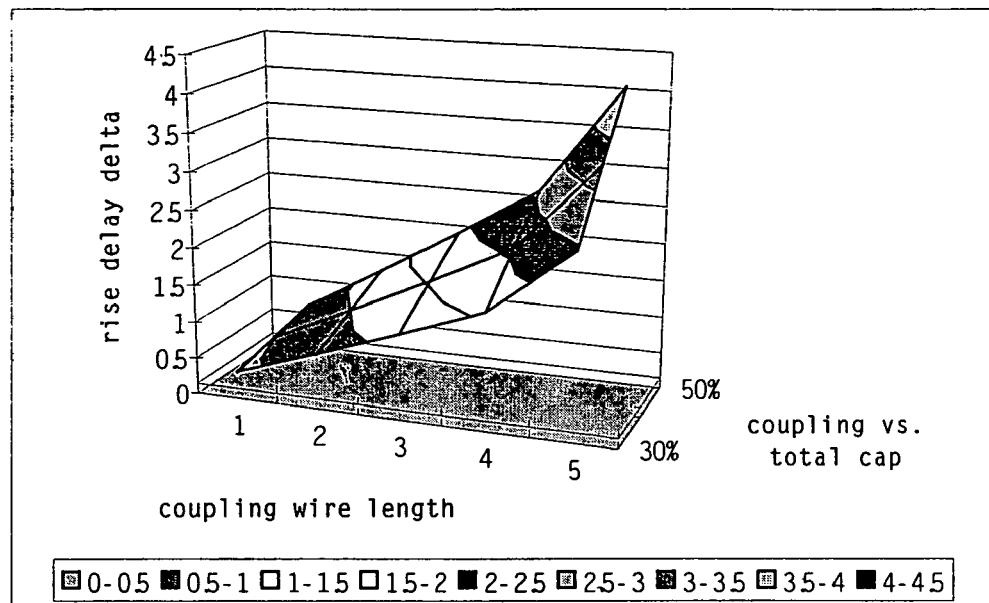
FIGS. 4a-b, 5, 6, and 7 are sample charts showing results of example modeling and simulation for the example circuit topology of FIG. 3.
Figure 4B:
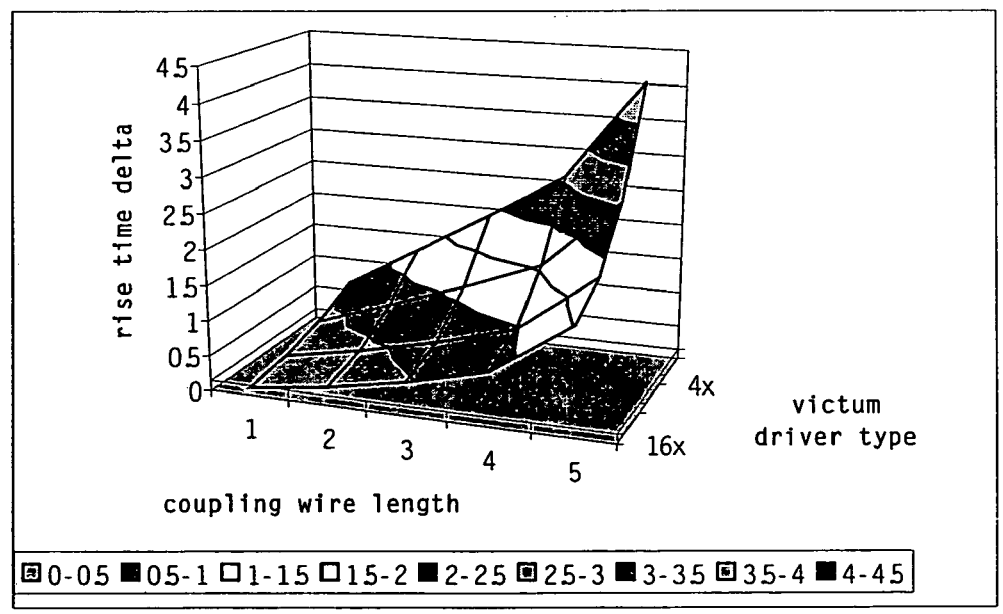

Modeling is performed to pre-characterize this device topology 302. According to an embodiment, the delay model is generated as a function of the three variables comprising aggressor driver size, ratio of coupling capacitors, and total wire lengths. The following is an example approach for determining delay impacts using 12 fitting parameters:

$$D = C*L + C^2*L + C*L^2 +$$
$$C^2*L^2 + (C*L + C^2*L + C*L^2 + C^2*L^2)*Ax +$$
$$(C*L + C^2*L + C*L^2 + C^2*L^2)*Ax^2$$

where
C: coupling Cap ratio
L: coupling wire length (mm)
Ax: Aggressor driver size The evaluation functionality is then driven by the different victim driver sizes, thereby resulting in a set of four-variable patterns. The delay impact can be modeled from the simulation, e.g., according to HSPICE results. The delay impact can be modeled and visually illustrated by charting the delay impact as a function of the different variables. FIG. 4A shows an example chart that illustrates the change in delay deltas as a function of the ratio of coupling capacitance versus the total capacitance over changes in the coupling wire length for an example circuit configuration. FIG. 4B shows an example chart that illustrates the change in rise time delta as a function of victim driver type over changes in the coupling wire length for an example circuit configuration.

In the example topology of FIG. 3, assume that aggressor wires 306 and 326 are simulated to switch coincident with and in the opposite direction to the switching signal in wire 316, with a coupled wire length ranging from 1.5 mm. to 4 mm. The current flow is physically in the same direction on all nets. Simulation is performed to generate a set of delay impact models, such as the example waveforms of FIG. 5, which shows example crosstalk coupled noise effects at 4 mm. of coupled length.

Figure 6:
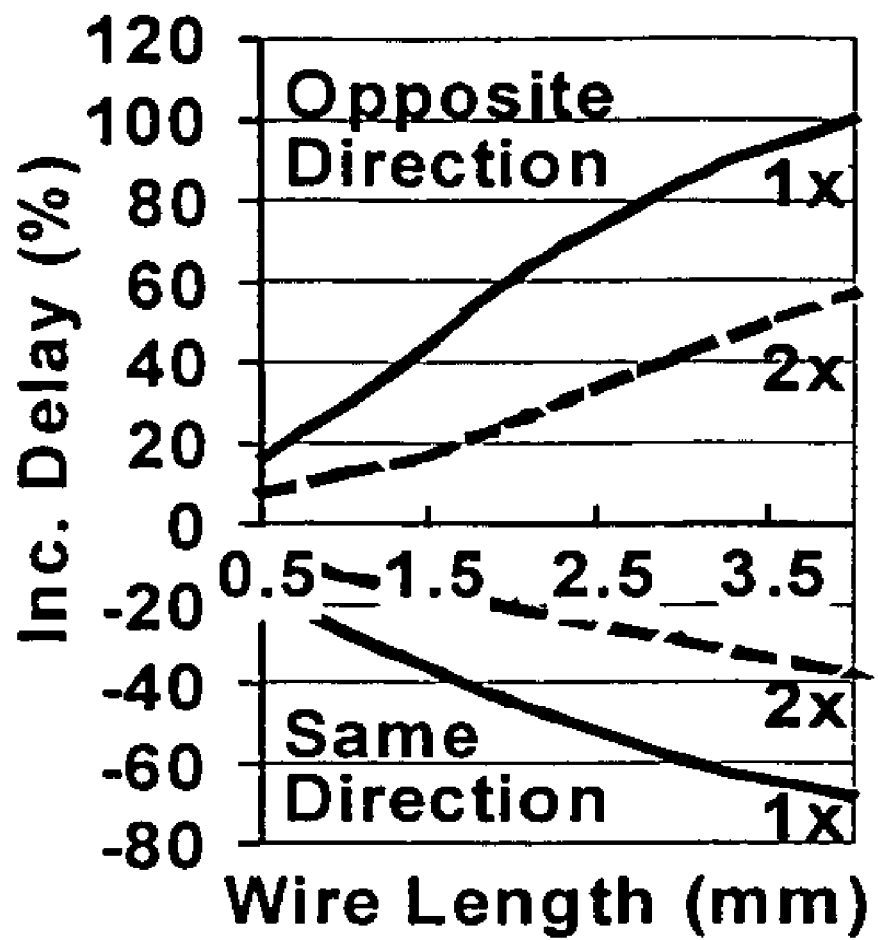
Figure 7:
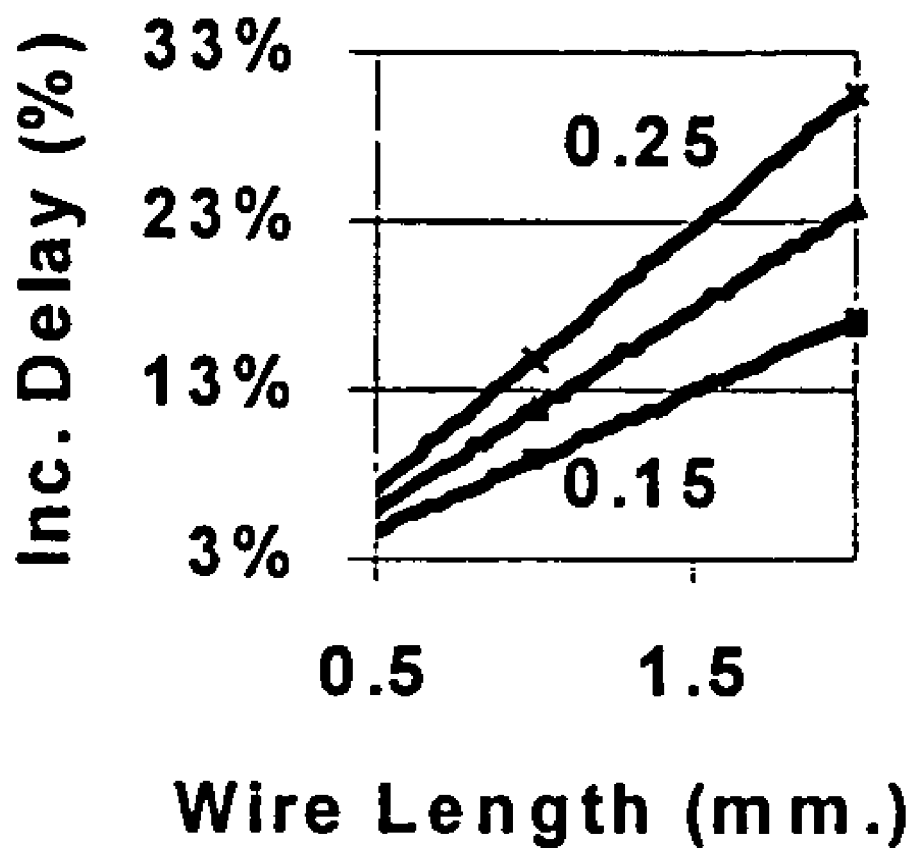

Calculating the exact coupling-dependent delay can be complex. In one embodiment, the delay uncertainty is bounded with a worst-case analysis. Asymptotic delay uncertainty as a function of coupled wire length is shown against driver-normalized delay in the example chart of FIG. 6. This example diagram is based on 100% coupling across the wirelength. FIG. 7 is an enlarged view of FIG. 6. In addition, the parameterized lines show the percentage of coupling over the wirelength, ranging from 15% to 25%. In this case also, both neighbors switch concurrently in the direction opposite to the affected signal. For level-sensitive signals, the delay uncertainty can be bounded by restricting the coupled wirelength to, for example, <2.5 mm.

Figure 5:
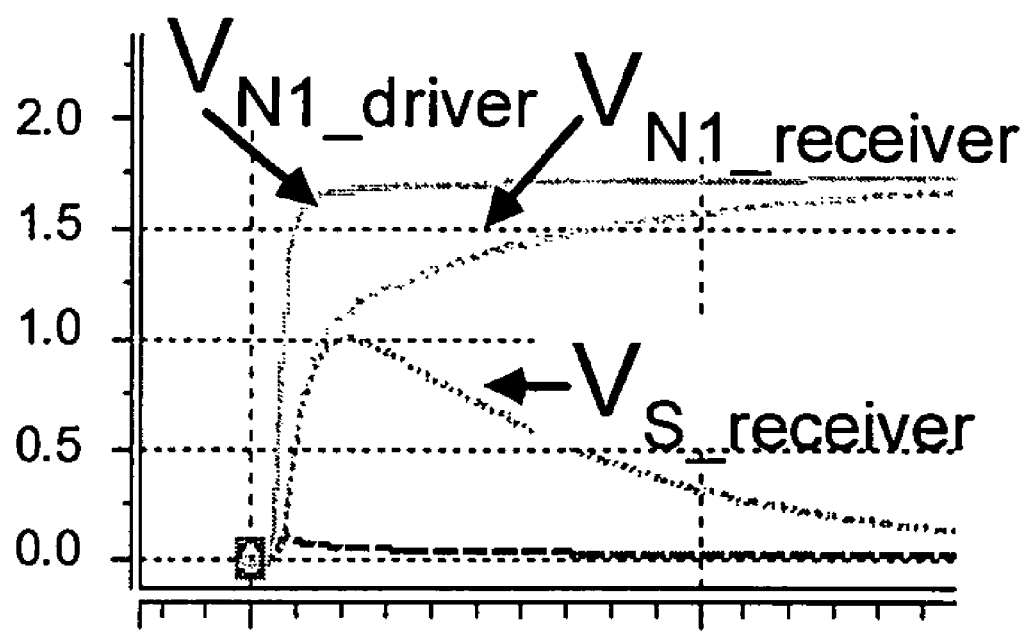

These simulation/modeling results are used to create a set of multi-variable patterns corresponding to the different variable values used for the modeling process. The results of these simulations are used to develop a numerical model which could predict the effect of delay degradation or reduction as a function of these four variables without requiring full circuit simulation. Exhaustive analysis of the design with respect to these four variables can then be performed. If the eventual IC design includes a portion having the topology shown in FIG. 3 having a modeled pattern, then the specific pattern of variable values corresponding to the design can be identified and used to determine the expected delay impact, e.g., as shown in the charts of FIGS. 5-7. Design modifications can be made to correct for excessive delays effects, e.g., in terms of adding buffers, modifying driver strengths and/or enhancing grid spacing—to ensure acceptable crosstalk immunity before design tape-out.

Assume that in an example design, at 4 mm. of coupled wirelength, the coupled noise creates a threshold-crossing signal at the receiver. If the receivers' input was edge-sensitive, this would create a false latching event, which can be identified based upon the modeling results. If this occurs, then it can be designed-out by shielding such signals and managing coupled wirelengths. Edge-sensitive signals are protected by either shielding them or by leaving adjacent routing tracks free. As shown in FIGS. 6 and 7, it can be seen that spacing signals two-grids-apart reduces the asymptotic delay uncertainty by about 50%.

Figure 8:
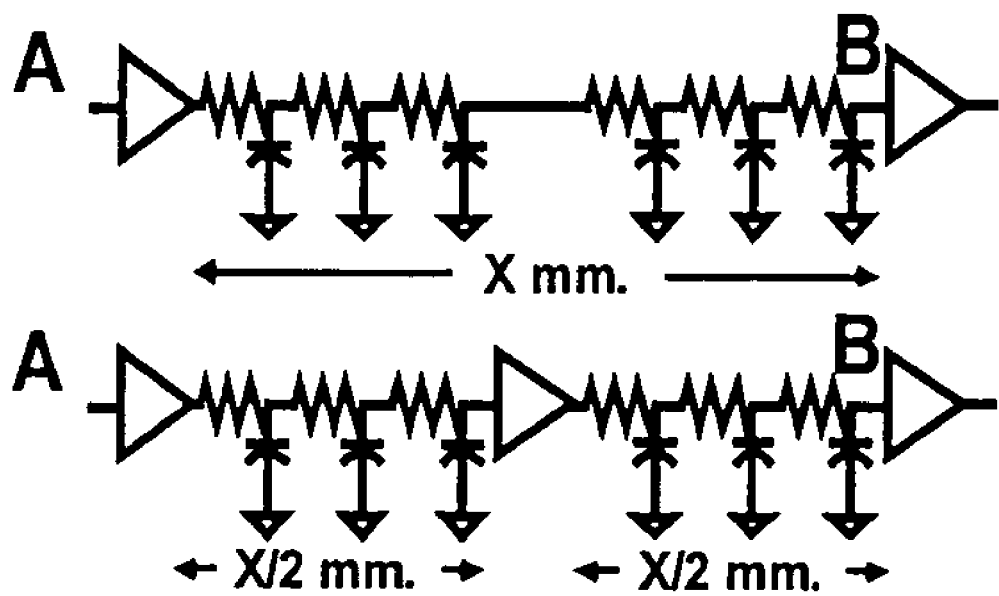
FIG. 8 shows an example buffer circuit to correct crosstalk effects if present in the topology of FIG. 3.
Figure 9:
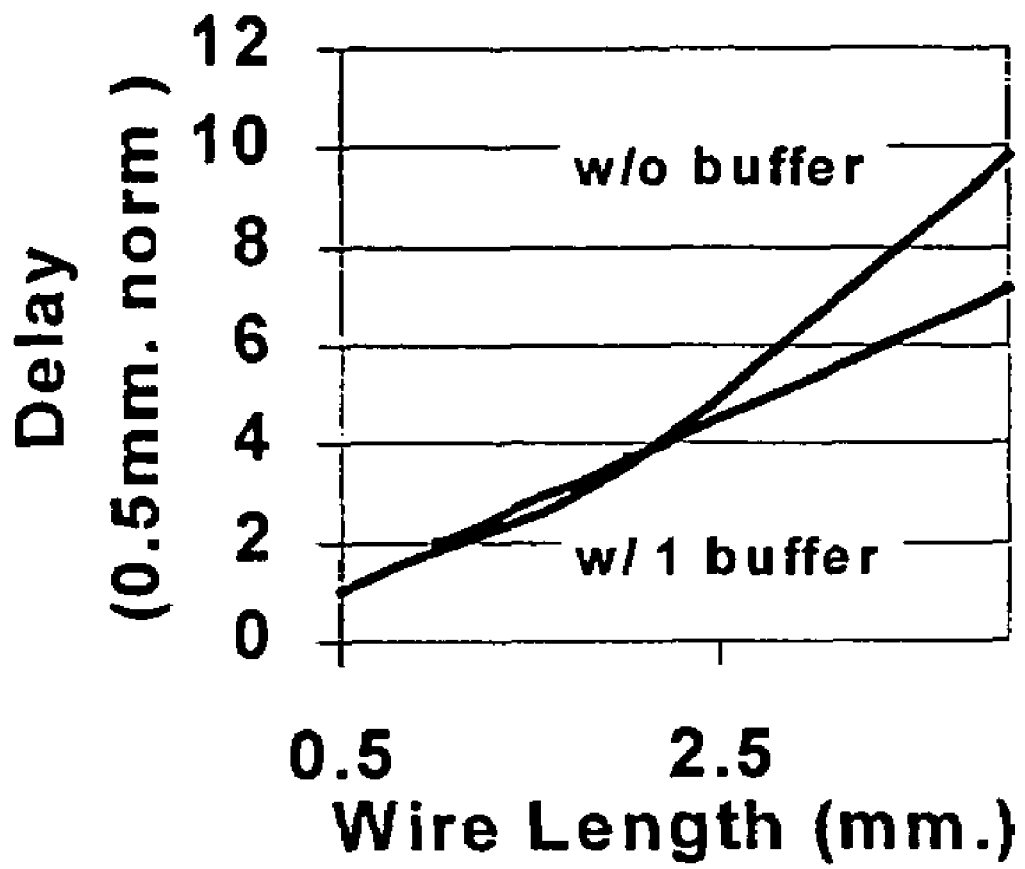
FIG. 9 shows a sample chart comparing example simulation/modeling results with respect to the buffer circuitry of FIG. 8.

Circuit simulation analysis can also be used to show that the overall delay of signal nets longer than 2.5 mm. can be reduced by inserting buffers to improve signal quality in the RC transmission lines. An example buffer insertion analysis schematic is shown in FIG. 8. Example simulation results for the circuit with and without the buffer are summarized in FIG. 9. Based on these analyses, threshold points can be identified to insert buffers in signal nets where signal wirelengths are initially longer than 1.5 to 2.5 mm, depending on net-specific timing and signal integrity requirements. Delay contributions, e.g., of 130 picoseconds per stage, can be added to static timing analysis for worst case timing verification. Further, hold time can be verified, e.g., at zero nanoseconds, with de-rated back-annotation loading to eliminate the potential for design failure due to crosstalk-induced delay reduction.

Therefore, what has been described is an inventive approach for crosstalk and signal integrity analysis. These and other embodiments of the present invention may be realized in accordance with the above teachings and it should be evident that various modifications and changes may be made to the above-described embodiments without departing from the broader spirit and scope of the invention. The specification and drawings are, accordingly, to be regarded in an illustrative rather than restrictive sense and the invention measured only in terms of the claims.

What is claimed is:

1. A method for performing crosstalk analysis for the design of an integrated circuit, comprising:
   characterizing a set of IC components based upon values of a plurality of variables comprising wirelength values, aggressor driver type values, victim driver type values, and ratio of coupling capacitance values;
   identifying at least one of a set of patterns based at least in part upon the values of the plurality of variables;
   analyzing an IC design to identify existence of any patterns from the set of patterns; and determining delay impact of crosstalk based at least in part upon an act of identifying the existence of any patterns.

2. The method of claim 1 in which device-level simulation is performed for the act of characterizing the set of IC components.

3. The method of claim 2 in which approximately or at least 192 simulations per delay transition edge are performed.

4. The method of claim 2 in which the delay impact is evaluated against one or more of the plurality of variables to determine crosstalk impact.

5. The method of claim 4 in which asymptotic delay uncertainty is tracked as a function of coupled wire length against driver-normalized delay.

6. The method of claim 2 in which HSPICE is employed for the device-level simulation.

7. The method of claim 1 in which delay uncertainty is bounded with worst-case analysis.

8. The method of claim 1 in which the IC design in its entirety is analyzed for the existence of the patterns.

9. The method of claim 1 in which only specified portions of the IC design are analyzed for the existence of the patterns.

10. The method of claim 9 in which only wires having a given location, length, or specified characteristic are analyzed for the existence of any patterns.

11. The method of claim 1 in which the delay impact is determined based upon numerical models for delay developed from characterizing the set of IC components.

12. The method of claim 1, further comprising:
modifying the IC design if excessive crosstalk effects are identified.

13. The method of claim 12 in which a replace or insert methodology is applied to modify the IC design.

14. The method of claim 13 in which the replace or insert methodology comprises adding buffers, modifying driver strengths, and/or enhancing grid spacing.

15. A system for performing crosstalk analysis for the design of an integrated circuit, comprising:
means for characterizing a set of IC components based upon values of a plurality of variables comprising wirelength values, aggressor driver type values, victim driver type values, and ratio of coupling capacitance values;
means for identifying at least one of a set of patterns based at least in part upon the values of the plurality of variables;
means for analyzing an IC design to identify existence of any patterns from the set of patterns; and
means for determining delay impact of crosstalk based at least in part upon an act of identifying the existence of any patterns.

16. A computer program product comprising a computer usable medium having executable code to execute a process for performing crosstalk analysis for the design of an integrated circuit, the process comprising:
characterizing a set of IC components based upon values of a plurality of variables comprising wirelength values, aggressor driver type values, victim driver type values, and ratio of coupling capacitance values;
identifying at least one of a set of patterns based at least in part upon the values of the plurality of variables;
analyzing an IC design to identify existence of any patterns from the set of patterns; and
determining delay impact of crosstalk based at least in part upon an act of identifying the existence of patterns.

* * * * *